US012635442B2

(12) United States Patent
Brock et al.

(10) Patent No.: US 12,635,442 B2
(45) Date of Patent: May 19, 2026

(54) METHOD FOR CLEANING A SEMICONDUCTOR WAFER

(71) Applicant: SILTRONIC AG, Munich (DE)

(72) Inventors: Damian Brock, Sankt Wolfgang (DE); Albert Kuehnstetter, Burghausen (DE)

(73) Assignee: SILTRONIC AG, Munich (DE)

( * ) Notice: Subject to any disclaimer, the term of this patent is extended or adjusted under 35 U.S.C. 154(b) by 40 days.

(21) Appl. No.: 18/701,273

(22) PCT Filed: Oct. 28, 2022

(86) PCT No.: PCT/EP2022/080179
§ 371 (c)(1),
(2) Date: Apr. 15, 2024

(87) PCT Pub. No.: WO2023/083628
PCT Pub. Date: May 19, 2023

(65) Prior Publication Data
US 2025/0201547 A1 Jun. 19, 2025

(30) Foreign Application Priority Data

Nov. 12, 2021 (EP) .................................... 21207969

(51) Int. Cl.
*H10P 70/00* (2026.01)
*H10P 72/00* (2026.01)
(52) U.S. Cl.
CPC .......... *H10P 70/18* (2026.01); *H10P 72/0414* (2026.01)
(58) Field of Classification Search
CPC ......... H01L 21/02052; H01L 21/02054; H01L 21/67051; H01L 21/02057
See application file for complete search history.

(56) References Cited

U.S. PATENT DOCUMENTS

| | | |
|---|---|---|
| 12,062,556 B2 | 8/2024 | Chen et al. |
| 2004/0103915 A1 | 6/2004 | Verhaverbeke et al. |

(Continued)

FOREIGN PATENT DOCUMENTS

| | | | | |
|---|---|---|---|---|
| EP | 0905747 A1 | 3/1999 | | |
| JP | 2015220284 A | * 12/2015 | ........... | H01L 21/304 |

(Continued)

OTHER PUBLICATIONS

KR2010-0049856A machine translation (Year: 2010).*
JP2015-220284A machine translation (Year: 2015).*

*Primary Examiner* — Douglas Lee
(74) *Attorney, Agent, or Firm* — LEYDIG, VOIT & MAYER, LTD.

(57) ABSTRACT

A side of a semiconductor wafer is cleaned in the following order: (1) executing a first cleaning step, cleaning with ozonized water, and a subsequent rinsing step, rinsing with purified water; (2) executing a second cleaning step, which includes, executing a first treatment step, including treating with ozonized water, which is followed by executing a second treatment step, treating with a hydrogen fluoride (HF)-containing liquid, where the second cleaning step may be repeated multiply; (3) executing a third cleaning step, cleaning with ozonized water, and executing a subsequent rinsing step, rinsing with purified water; and (4) executing a drying step. A preliminary cleaning step, which includes cleaning the side of the semiconductor with water, is executed directly before the first cleaning step so that the side of the semiconductor wafer is still wet while the first cleaning step commences.

8 Claims, 1 Drawing Sheet

(56) References Cited

U.S. PATENT DOCUMENTS

| | | | | |
|---|---|---|---|---|
| 2006/0234503 A1* | 10/2006 | Yamada | ........... | H01L 21/67051 |
| | | | | 257/E21.228 |
| 2007/0228524 A1* | 10/2007 | Hayashida | ........ | H01L 21/02052 |
| | | | | 257/618 |
| 2009/0040512 A1 | 2/2009 | Nabeshima et al. | | |
| 2014/0048100 A1 | 2/2014 | Abe et al. | | |

FOREIGN PATENT DOCUMENTS

| | | | | | |
|---|---|---|---|---|---|
| JP | 2021522684 A | | 8/2021 | | |
| KR | 20100049856 A | * | 5/2010 | ....... | H01L 21/02052 |
| WO | WO 9620498 A1 | | 7/1996 | | |
| WO | WO 2005101483 A1 | | 10/2005 | | |
| WO | WO 2015174004 A1 | | 11/2015 | | |

* cited by examiner

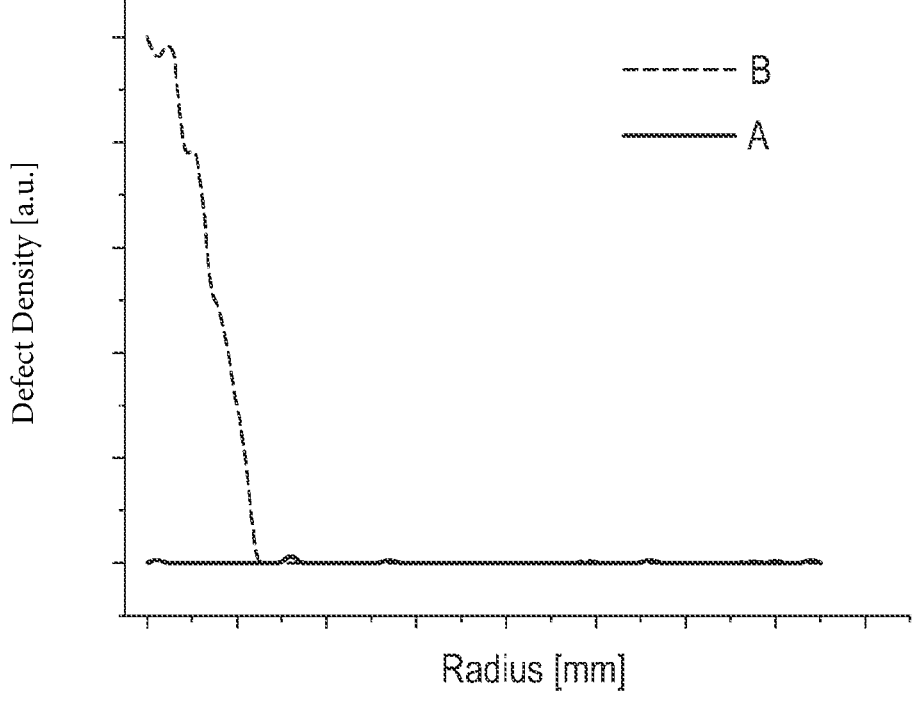

METHOD FOR CLEANING A SEMICONDUCTOR WAFER

CROSS REFERENCE TO RELATED APPLICATIONS

This application is a U.S. National Phase application under 35 U.S.C. § 371 of International Application No. PCT/EP2022/080179, filed on Oct. 28, 2022, and claims benefit to European Patent Application No. EP 21207969.3, filed on Nov. 12, 2021. The International Application was published in German on May 19, 2023 as WO 2023/083628 A1 under PCT Article 21 (2).

FIELD

The present disclosure is directed to a process for cleaning a semiconductor wafer.

BACKGROUND

Semiconductor wafers serving, for example, as substrates for the production of micro-electronic components, and usually silicon wafers, are cleaned, for example after polishing and coating (by epitaxial deposition, for example), or thermal treatment steps ("annealing"), and/or before high-temperature operating steps, using wet-chemical processes. The aim of the cleaning is, as far as possible, to remove semiconductor wafer contamination, for example caused by metals (such as copper) or by organic substances, and also, as far as possible, to remove particles adhering to the wafer surface. The reason being that, such contamination, in the subsequent production of components, leads to problems, examples being the uneven growth of the gate oxides, or the uneven deposition of the polysilicon gates.

Processes employed in this context include single-wafer cleaning processes, in which a semiconductor wafer is rotated rapidly about its center axis and at the same time is first cleaned with one or more liquids, then rinsed with deionized water, and dried. The liquids are applied to the rotating semiconductor wafer and are accelerated toward the wafer edge by the centrifugal force, causing the liquids to run off outwardly and leaving a thin film which covers generally the entire surface of the wafer. During subsequent drying with further rotation of the semiconductor wafer, with addition, for example, of a vapor (of isopropanol, for example) that reduces the surface tension of the liquid film, the entirety of the liquid film runs off outwardly. Such processes are described in, for example, US 2004/0 103 915 A1 and EP 0 905 747 A1.

The specification US 2014/048 100 A1 discloses a process for cleaning semiconductor wafers that uses the following steps:

(1) a first cleaning step for cleaning with ozonized water and subsequent rinsing step with purified water, (2) a second cleaning step, which comprises a treatment step with ozonized water, which is followed by a treatment step with an HF-containing liquid, where the second cleaning step may be repeated multiply, (3) a third cleaning step for cleaning with ozonized water and subsequent rinsing step with purified water, (4) a drying step, in which the semiconductor wafer is dried.

In testing out this process, the inventors found that defect patterns can occur on the wafer that are measurable with an LLS measurement tool. These defects apparently occur preferentially in the center of the substrate and may have adverse consequences for the behavior of the semiconductor wafers affected in the component manufacturing operation.

SUMMARY

In an embodiment, the present disclosure provides a process for cleaning a side of a semiconductor wafer, which is executed in the following order: (1) executing a first cleaning step, including cleaning the side of the semiconductor wafer with ozonized water, and executing a subsequent rinsing step, including rinsing the side of the semiconductor wafer with purified water; (2) executing a second cleaning step, which includes, executing a first treatment step, including treating the side of the semiconductor wafer with ozonized water, which is followed by executing a second treatment step, including treating the side of the semiconductor wafer with a hydrogen fluoride (HF)-containing liquid, where the second cleaning step may be repeated multiply; (3) executing a third cleaning step, including cleaning the side of the semiconductor wafer with ozonized water, and executing a subsequent rinsing step, including rinsing the side of the semiconductor wafer with purified water; and (4) executing a drying step, including drying the side of the semiconductor wafer. A preliminary cleaning step, which includes cleaning the side of the semiconductor with water, is executed directly before the first cleaning step so that the side of the semiconductor wafer is still wet while the first cleaning step commences.

BRIEF DESCRIPTION OF THE DRAWINGS

Subject matter of the present disclosure will be described in even greater detail below based on the exemplary FIGURES. All features described and/or illustrated herein can be used alone or combined in different combinations. The features and advantages of various embodiments will become apparent by reading the following detailed description with reference to the attached drawings, which illustrate the following:

FIG. 1 shows, in the form of an illustration, the radial defect density which can be measured after a semiconductor wafer has been treated by the process known from the prior art (A); and another semiconductor wafer has been cleaned with the process of an embodiment of the present disclosure. It is apparent that the process (B) is better able to avoid defects in the center of the semiconductor wafer than the prior art process (A).

DETAILED DESCRIPTION

Aspects of the present disclosure provide a process that does not have the defects observed in the state of the art, or at least minimizes the likelihood of the occurrence of these defects.

Abbreviations

DIW deionized water.

O3W ozonized water consisting of 15-20 ppm ozone (O3) dissolved in deionized water.

SC1 "Standard Clean 1" containing 0.3% tetramethylammonium hydroxide (TMAH, [N(CH3)4]OH) and 0.7% hydrogen peroxide (H2O2) in deionized water.

HF 0.5%-1% hydrogen fluoride (HF) dissolved in deionized water.

DRY drying operation carried out in a 100% nitrogen atmosphere (N2).

In testing out a prior art process for the cleaning of semiconductor wafers using a single-wafer cleaner apparatus, the inventors determined the possible occurrence on the wafer of defect patterns, which are measurable with an LLS measurement.

These defect patterns can be visualized by a light scattering measurement, using an instrument from KLA-Tencor and the Surfscan SP1 MX, for example, and are therefore referred to as localized light scattering defects. WO 2005101483 A1 discloses a technique for scattered light measurement of epitaxially coated semiconductor wafers.

As FIG. 1 shows, these defects occur preferentially in the center of the semiconductor wafer. They may have adverse consequences for the behavior of the semiconductor wafers affected in the component manufacturing operation.

In attempting to eliminate the occurrence of these defects, the inventors found that it is advantageous, and therefore preferable, first to carry out a first cleaning step for cleaning with ozonized water and a subsequent rinsing step with purified water, and then to carry out a second cleaning step, which comprises a treatment step with ozonized water, followed by a treatment step with an HF-containing liquid, where the second cleaning step may be repeated multiply, then to carry out a third cleaning step for cleaning with ozonized water and subsequent rinsing step with purified water, and to carry out a drying step wherein the side of the semiconductor wafer is dried.

It is preferred here for there to be a preliminary cleaning step with water directly before the first cleaning step. The inventors have discovered that advantageous aspects of the present disclosure are enabled by ensuring that the side of the semiconductor wafer that undergoes the cleaning is still wet before the first cleaning step commences.

The inventors here have further recognized that it is preferred if, during the preliminary cleaning step, the fraction of ozonized water is raised from 0% at the start of the preliminary cleaning step to 100% at the end of the preliminary cleaning step, the duration with a fraction of less than 5% being less than 10 s and greater than 1 s.

This continuous increase in the fraction of ozonized water between the preliminary cleaning step through to the first cleaning step apparently has the effect of further lowering the number of defects found.

It is particularly preferred if the preliminary cleaning step lasts for at least 1 s and not more than 15 s, the step very preferably lasting for at least 3 s and not more than 8 s.

The inventors have discovered that advantageous aspects of the present disclosure are enabled by ensuring that the side of the semiconductor wafer that is to be cleaned is aligned horizontally and is rotated during the preliminary cleaning step at a velocity of greater than 500 rpm and less than 1000 rpm.

It is particularly preferred if a nozzle is used for applying the water in the preliminary cleaning step. The nozzle flow velocity in this case is more preferably between 0.5 m/s and 2 m/s, with the associated flow rate being preferably between 0.5 l/min and 1.5 l/min.

It is likewise preferred for the nozzle to be aligned such that the direction of the nozzle flow forms an angle α with the surface of the semiconductor wafer that is smaller than 70° and larger than 30°.

One especially preferred embodiment of the process of the present disclosure is shown in table 1.

TABLE 1

| Step # | Designation | Medium | Concentration | Time [s] |
|---|---|---|---|---|
| 0 | DIW | DIW | | 3-8 |
| 1 | O3W | $O_3$ + DIW | 15-20 ppm | 25 |
| 2 | DIW | DIW | | 10 |
| 3 | SC1 | TMAH + $H_2O_2$ + DIW | TMAH 0.3%. $H_2O_2$ 0.7% | 20 |
| 4 | DIW | DIW | | 20 |
| 5 | O3W | $O_3$ + DIW | 15-20 ppm | 20 |
| 6 | HF | HF + DIW | 0.5-1% | 3 |
| 7 | O3W | $O_3$ + DIW | 15-20 ppm | 20 |
| 8 | HF | HF + DIW | 0.5-1% | 3 |
| 9 | O3W | $O_3$ + DIW | 15-20 ppm | 20 |
| 10 | HF | HF + DIW | 0.5-1% | 3 |
| 11 | O3W | $O_3$ + DIW | 15-20 ppm | 20 |
| 12 | DIW | DIW | | 10 |
| 13 | DRY | $N_2$ | | 26 |

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A process for cleaning a side of a semiconductor wafer, the process comprising, in the order given:

(1) executing a first cleaning step, comprising cleaning the side of the semiconductor wafer with ozonized water, and executing a subsequent rinsing step, comprising rinsing the side of the semiconductor wafer with purified water;

(2) executing a second cleaning step, which comprises, executing a first treatment step, comprising treating the side of the semiconductor wafer with ozonized water, which is followed by executing a second treatment step, comprising treating the side of the semiconductor wafer with a hydrogen fluoride (HF)-containing liquid, where the second cleaning step may be repeated multiply;

(3) executing a third cleaning step, comprising cleaning the side of the semiconductor wafer with ozonized water, and executing a subsequent rinsing step, comprising rinsing the side of the semiconductor wafer with purified water; and (4) executing a drying step, comprising drying the side of the semiconductor wafer, wherein the process further comprises executing a preliminary cleaning step, comprising cleaning the side of the semiconductor with water directly before the first cleaning step, so that the side of the semiconductor wafer is still wet while the first cleaning step commences.

2. The process as claimed in claim 1, wherein during the preliminary cleaning step, the fraction of ozonized water is raised from 0% at the start of the preliminary cleaning step to 100% at the end of the preliminary cleaning step, the duration with a fraction of less than 5% being less than 10 s and greater than 1 s.

3. The process as claimed in claim 1, wherein the preliminary cleaning step lasts for at least 1 s and not more than 15 s.

4. The process as claimed in claim 1, wherein the side of the semiconductor wafer is aligned horizontally and during the preliminary cleaning step is rotated at a velocity of greater than 500 rpm and less than 1000 rpm.

5. The process as claimed in claim 1, wherein a nozzle is used to apply the water in the preliminary cleaning step, and the nozzle flow velocity in this case is between 0.5 m/s and 2 m/s, with the associated flow rate being between 0.5 l/min and 1.5 l/min.

6. The process as claimed in claim 5, wherein the nozzle is aligned such that the direction of the nozzle flow forms an angle α with the surface of the semiconductor wafer that is smaller than 70° and larger than 30°.

7. A process for cleaning a side of a semiconductor wafer, the process comprising, in the order given:

executing a preliminary cleaning step, comprising cleaning the side of the semiconductor with water directly before the first cleaning step, so that the side of the semiconductor wafer is still wet while the first cleaning step commences;

while the side of the semiconductor wafer is still wet with the water from the preliminary cleaning step, executing a first cleaning step, comprising cleaning the side of the semiconductor wafer with ozonized water, and executing a subsequent rinsing step, comprising rinsing the side of the semiconductor wafer with purified water;

executing a second cleaning step, which comprises, executing a first treatment step, comprising treating the side of the semiconductor wafer with ozonized water, which is followed by executing a second treatment step, comprising treating the side of the semiconductor wafer with a hydrogen fluoride (HF)-containing liquid, where the second cleaning step may be repeated multiply;

executing a third cleaning step, comprising cleaning the side of the semiconductor wafer with ozonized water, and executing a subsequent rinsing step, comprising rinsing the side of the semiconductor wafer with purified water; and executing a drying step, comprising drying the side of the semiconductor wafer.

8. The process as claimed in claim 7, wherein:

cleaning the side of the semiconductor wafer with water during the execution of the preliminary cleaning step comprises cleaning the side of the semiconductor with deionized water for 3-8 seconds, executing the first cleaning step comprises, while the side of the semiconductor wafer is still wet with the deionized water from the preliminary cleaning step, cleaning the side of the semiconductor wafer with ozonized water having 15-20 ppm ozone dissolved in deionized water for 25 seconds, executing the subsequent rinsing step comprises rinsing the side of the semiconductor wafer with deionized water for 10 seconds, the process further comprises, after executing the subsequent rinsing step and before executing the first treatment step:

cleaning the side of the semiconductor wafer with a fluid containing 0.3% tetramethylammonium hydroxide and 0.7% hydrogen peroxide in deionized water for 20 seconds; and then rinsing the side of the semiconductor wafer with deionized water for 20 seconds, executing the second cleaning step, comprises:

executing the first treatment step in a first instance by treating the side of the semiconductor wafer with ozonized water having 15-20 ppm ozone dissolved in deionized water for 20 seconds;

executing the second treatment step in a first instance by treating the side of the semiconductor wafer with the HF-containing liquid having 0.5%-1% HF dissolved in deionized water for 3 seconds;

executing the first treatment step in a second instance by treating the side of the semiconductor wafer with ozonized water having 15-20 ppm ozone dissolved in deionized water for 20 seconds;

executing the second treatment step in a second instance by treating the side of the semiconductor wafer with the HF-containing liquid having 0.5%-1% HF dissolved in deionized water for 3 seconds;

executing the first treatment step in a third instance by treating the side of the semiconductor wafer with ozonized water having 15-20 ppm ozone dissolved in deionized water for 20 seconds; and executing the second treatment step in a third instance by treating the side of the semiconductor wafer with the HF-containing liquid having 0.5%-1% HF dissolved in deionized water for 3 seconds, the cleaning of the side of the semiconductor wafer with ozonized while executing the third cleaning step comprises cleaning the side of the semiconductor wafer with ozonized water having 15-20 ppm ozone dissolved in deionized water for 20 seconds;

the rinsing of the side of the semiconductor wafer with purified water in the subsequent rinsing step of the third cleaning step comprises rinsing the side of the semiconductor wafer with deionized water for 10 seconds, and the drying of the side of the semiconductor wafer while executing the drying step is carried out in a 100% nitrogen atmosphere for 26 seconds.

* * * * *